United States Patent

Okubo et al.

[11] Patent Number: 5,965,324
[45] Date of Patent: Oct. 12, 1999

[54] LIGHT SENSITIVE COMPOSITION AND METHOD FOR MANUFACTURING PLANOGRAPHIC PRINTING PLATE EMPLOYING THE SAME

[75] Inventors: Kimihiko Okubo; Noritaka Nakayama, both of Hino, Japan

[73] Assignee: Konica Corporation, Tokyo, Japan

[21] Appl. No.: 08/896,847

[22] Filed: Jul. 18, 1997

[30] Foreign Application Priority Data

Jul. 24, 1996 [JP] Japan .................................. 8-194675

[51] Int. Cl.⁶ ...................................................... G03F 7/031
[52] U.S. Cl. .................... 430/281.1; 430/920; 430/916; 430/921; 430/922; 430/926; 430/947; 522/16; 522/24; 522/25; 522/26
[58] Field of Search ................................ 430/281.1, 920, 430/916, 921, 922, 926, 947; 522/16, 24, 25, 26

[56] References Cited

U.S. PATENT DOCUMENTS

| | | | |
|---|---|---|---|
| 4,636,459 | 1/1987 | Kawamura et al. | 430/281.1 |
| 4,855,468 | 8/1989 | Riediker et al. | 430/286.1 |
| 4,868,092 | 9/1989 | Kawabata et al. | 430/287.1 |
| 5,061,605 | 10/1991 | Kawamura et al. | 430/281.1 |
| 5,445,918 | 8/1995 | Doba et al. | 430/285.1 |

FOREIGN PATENT DOCUMENTS

| | | |
|---|---|---|
| 0 410 654 A2 | 1/1991 | European Pat. Off. . |
| 0 591 786 A2 | 4/1994 | European Pat. Off. . |
| 0 689 095 A1 | 12/1995 | European Pat. Off. . |
| 0 704 764 A1 | 4/1996 | European Pat. Off. . |
| 9-43843 | 2/1997 | Japan . |

*Primary Examiner*—Cynthia Hamilton
*Attorney, Agent, or Firm*—Frishauf, Holtz, Goodman, Langer & Chick, P.C.

[57] ABSTRACT

A light sensitive composition and a manufacturing method of a planographic printing plate employing the same are disclosed, the composition comprising a radical generating agent and a dye represented by the following formula (1), (2) or (3):

formula (1)

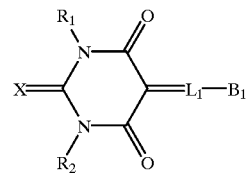

formula (2)

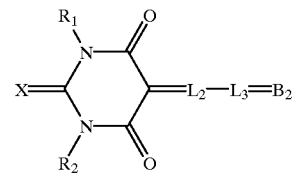

formula (3)

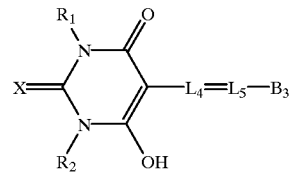

9 Claims, No Drawings

LIGHT SENSITIVE COMPOSITION AND METHOD FOR MANUFACTURING PLANOGRAPHIC PRINTING PLATE EMPLOYING THE SAME

FIELD OF THE INVENTION

The present invention relates to a light sensitive composition comprising a novel dye and a radical generating agent, a photopolymerizable composition, a radical generating method, a light sensitive composition for a presensitized planographic printing plate and a manufacturing method of a planographic printing plate, and particularly to a photopolymerizable composition comprising a radical generating agent, a barbituric acid or thiobarbituric acid type methine, azo, azomethine or dimethine dye and a compound having an ethylenically unsaturated bond, which is useful for ink, a presensitized printing plate, a photoresist, a direct printing plate, a proof for graphic arts, a hologram material, a filling stuff, an adhesive or a photo-molding material and is capable of giving a photo-hardened composition with good physical properties by exposing to a visible light, a radical generating method, and a method of manufacturing a light sensitive composition for a planographic printing plate or a planographic printing plate.

BACKGROUND OF THE INVENTION

Recently, use of a semiconductor laser or a YAG laser is increasing as an image recording laser in view of stability, compact and ease of maintenance. The technique shifting the wavelength of these lasers to shorter wavelength has been sought, and a laser (532 nm) employing SHG of a YAG laser is put into practical use.

A method of forming an image is known which comprises the steps of exposing a photopolymerizable composition to a laser such as a semiconductor laser or a YAG laser to cause radical polymerization to harden at exposed portions, whereby difference of physical property between the exposed and unexposed portions is produced, and then to develop to form an image.

In order to form an image employing a laser exposure, a light sensitive composition suitable for a laser light wavelength is necessary, and a radical generating agent as a radical polymerization initiator has been studied. Most radical generating agents alone have absorption only at ultra violet wavelength regions. The agents are ordinarily used in combination with a sensitizing dye capable of absorbing a light emitted from a light source.

Various combinations (hereinafter referred to also as initiator compositions) of a sensitizing dye for a 488 nm argon laser or a 532 nm W-YAG laser with a radical generating agent are known.

A specific photo-reducing dye as an effective sensitizing dye is described in U.S. Pat. No. 2,850,445. An initiator composition comprising a dye and amines is disclosed in Japanese Patent Publication No. 44-20189, an initiator composition comprising a biimidazole and a radical generating agent in Japanese Patent Publication No. 45-37377, an initiator composition comprising a biimidazole and dialkylaminobenzylideneketones in Japanese Patent Publication No. 47-2528 and Japanese Patent O.P.I. Publication No. 54-55292, an initiator composition comprising a keto-substituted cumarin and an active halogenated compound in Japanese Patent O.P.I. Publication No. 58-15503, and an initiator composition comprising a substituted triazine and a merocyanine dye in Japanese Patent O.P.I. Publication No. 54-15102. However, the above techniques have problems in sensitivity and storage stability.

SUMMARY OF THE INVENTION

The present invention has been made to solve the above problems.

A first object of the invention is to provide a photopolymerizable composition with high sensitivity which is capable of writing with a 488 or approx. 532 nm light and forming an excellent image with high resolution.

A second object of the invention is to provide a photopolymerizable composition with good storage stability.

A third object of the invention is to provide a radical generating method of generating a radical with high sensitivity by exposing to a 488 or approx. 532 nm light.

A fourth object of the invention is to provide a light sensitive material with excellent storage stability for a presensitized planographic printing plate having high sensitivity in the wavelength of a 488 or approx. 532 nm light and a manufacturing method of a planographic printing plate employing the light sensitive material.

A fifth object of the invention is to provide a photo-initiator with high sensitivity.

DETAILED DESCRIPTION OF THE INVENTION

The present inventors have made an extensive study and have found that a combination of a barbituric acid or thiobarbituric acid type methine dye, a barbituric acid or thiobarbituric acid type azo dye, a barbituric acid or thiobarbituric acid type azomethine dye or a barbituric acid or thiobarbituric acid type dimethine dye with specific pyrazoloazole methine or dimethine dye with a radical generating agent absorbs a 488 or 532 nm visible light and has a radical generating capability, and shows unexpected results providing high sensitivity and excellent storage stability. Thus, they have attained the present invention.

The object of the invention can be attained by the following constitution:

1 a photo-initiator comprising a radical generating agent and a dye represented by the following formula (1), (2) or (3):

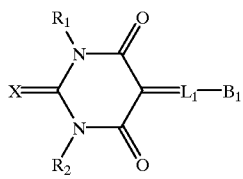

formula (1)

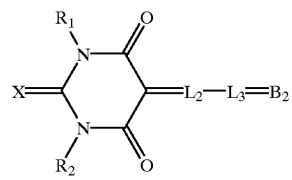

formula (2)

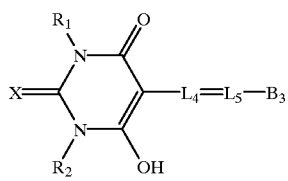

formula (3)

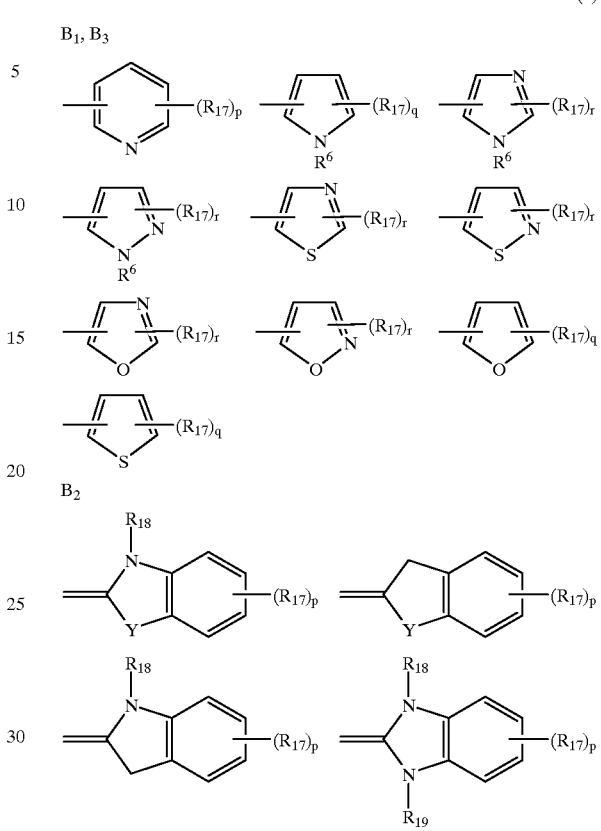

formula (4)

wherein $R_1$ and $R_2$ independently represent a hydrogen atom or a monovalent substituent, the monovalent substituent representing an alkyl group, an alkenyl group, an aryl group or a heterocyclic ring residue; X represents an oxygen atom or a sulfur atom; $L_1$, $L_2$, $L_3$, $L_4$, and $L_5$ independently represent a nitrogen atom or a methine group; and $B_1$, $B_2$ and $B_3$ independently represent an aromatic hydrocarbon ring residue or a 5- or 6-membered heterocyclic ring residue, 2 the photo-initiator of item 1, further containing an amine compound or a sulfur compound as a polymerization promoting agent, 3 a photopolymerizable composition comprising the photo-initiator of item 1 or 2 and a compound having an ethylenically unsaturated bond, 4 the photo-initiator of item 1 or 2, wherein the radical generating agent is selected from the group consisting of an organic peroxide, an onium compound, a halogenated triazine, an iron arene complex, a bisimidazole, and a titanocene compound, 5 the photopolymerizable composition of item 3, wherein the radical generating agent is selected from the group consisting of an organic peroxide, an onium compound, a halogenated triazine, an iron arene complex, a bisimidazole, and a titanocene compound, 6 a photo-initiator comprising a titanocene compound and a dye represented by formula (2) or (3) above, 7 a photopolymerizable composition comprising a titanocene compound and a dye represented by formula (2) or (3) above, 8 a method for generating a radical, the method comprising the step of exposing the photo-initiator of item 1, 2, 3 or 4 to a 488 nm or 532 nm laser light, 9 a light sensitive composition for a presensitized planographic printing plate comprising a hydrophilic support and provided thereon, a light sensitive layer and a protective layer in that order, wherein the light sensitive layer contains a compound having at least one ethylenically unsaturated bond, a binder and the photopolymerizable composition of item 3, 5 or 7, or 10 a method for manufacturing a planographic printing plate, the method comprising the steps of imagewise exposing a presensitized planographic printing plate to a 488 nm or 532 nm laser light, the presensitized planographic printing plate comprising a hydrophilic support and provided thereon, a light sensitive layer and a protective layer in that order, the light sensitive layer containing a compound having at least one ethylenically unsaturated bond, a binder and the photopolymerizable composition of item 3, 5 or 7, and then dissolving the protective layer and light sensitive layer at unexposed portions to remove.

The invention will be detailed below. The sensitizing dye represented by formula (1), (2) or (3) will be explained.

$B_1$, $B_2$ and $B_3$ in formula (1), (2) or (3) independently representing an aromatic hydrocarbon ring residue or a 5- or 6-membered heterocyclic ring residue include the following formula (4):

wherein $R_{17}$, represents a hydrogen atom, an alkyl group, an aryl group, $-OR_{18}$, $-SR_{18}$, or $-N(R_{19})(R_{20})$ in which $R_{18}$, $R_{19}$ and $R_{20}$ independently represent a hydrogen atom, an alkyl group or an aryl group; Y represents an oxygen atom or a sulfur atom; p represents an integer of 0 to 4; q represents an integer of 0 to 3; and r represents an integer of 0 to 2, provided that plural $R_{17}$ may be the same or different and combine with each other to form a ring.

In formula (1), (2), (3) or (4), the alkyl group represented by $R_1$, $R_2$, $R_{17}$, $R_{18}$, $R_{19}$ and $R_{20}$ is preferably a straight-chained or branched alkyl group having 1 to 12 carbon atoms (for example, methyl, ethyl, benzyl, phenetyl, propyl, isopropyl, butyl, isobutyl, pentyl, hexyl, octyl, nonyl, cyclopropyl, cyclopentyl or cyclohexyl), which may have a substituent.

The aryl group represented by $R_1$, $R_2$, $R_{17}$, $R_{18}$, $R_{19}$ and $R_{20}$ is preferably an aryl group having 6 to 12 carbon atoms (for example, phenyl or naphthyl), which may have a substituent.

The heterocyclic group represented by $R^1$ or $R^2$ is preferably a 5- or 6-membered heterocyclic group (for example, oxazolyl, benzoxazolyl, thiazolyl, imidazolyl, pyridyl, furyl, thiophenyl, sulfolanyl, pyrazolyl, pyrrolyl, chromanyl or cumaryl), which may have a substituent.

The alkenyl group represented by $R^1$ or $R^2$ is preferably an alkenyl group having 2 to 12 carbon atoms (for example, vinyl, allyl, 1-propenyl, 2-pentenyl or 1,3-butadienyl).

$L_1$, $L_2$, $L_3$, $L_4$ and $L_5$ independently represent a nitrogen arom or a methine group which may be substituted or unsubstituted.

The substituent which each of the above group may have includes a carboxyl group, a sulfonamide group having 1 to 12 carbon atoms (for example, methanesulfonamide, benzenesulfonamide, butanesulfonamide or n-octanesulfonamide), a sulfamoyl group having 0 to 12 carbon atoms (for example, unsubstituted sulfamoyl, methylsulfamoyl, phenylsulfamoyl or butylsulfamoyl), a sulfonylcarbamoyl group having 2 to 12 carbon atoms (for example, methanesulfonylcarbamoyl, propanesulfonylcarbamoyl or benzenesulfonylcarbamoyl), an acylsulfamoyl group having 1 to 12 carbon atoms (for example, acetylsulfamoyl, propionylsulfamoyl, pivaloylsulfamoyl or benzoylsulfamoyl), a straight-chained or branched alkyl group having 1 to 12 carbon atoms (for example, methyl, ethyl, isopropyl, butyl, hexyl, cyclopropyl, cyclopentyl, cyclohexyl, 2-hydroxyethyl, 4-carboxybutyl, 2-methoxyethyl, benzyl, phenetyl, 4-carboxybenzyl or 2-diethylaminoethyl), an alkenyl group having 2 to 12 carbon atoms (for example, vinyl, allyl or butenyl), an alkoxy group having 1 to 12 carbon atoms (for example, methoxy, ethoxy or butoxy), a halogen atom (for example, fluorine, chlorine or bromine), an amino group having 0 to 12 carbon atoms (for example, unsubstituted amino, dimethylamino, diethylamino or carboxyethylamino), an ester group having 2 to 12 carbon atoms (for example, methoxycarbonyl), an amido group having 1 to 12 carbon atoms (for example, acetylamino or benzamido), a carbamoyl group having 1 to 12 carbon atoms (for example, carbamoyl, methylcarbamoyl or phenylcarbamoyl), an aryl group having 6 to 12 carbon atoms (for example, phenyl, naphthyl, 4-carboxyphenyl, 3,5-dicarboxyphenyl, 4-methoxyphenyl, 4-methanesulfonamidophenyl or 4-butanesulfonamidophenyl), an aryloxy group having 6 to 10 carbon atoms (for example, phenoxy, 4-carboxyphenoxy, 4-methylphenoxy or naphthoxy), an alkylthio group having 1 to 8 carbon atoms (for example, methylthio, ethylthio or octylthio), an arylthio group having 6 to 10 carbon atoms (for example, phenylthio or naphthylthio), an acyl group having 1 to 10 carbon atoms (for example, acetyl, benzoyl or propanoyl), a sulfonyl group having 1 to 10 carbon atoms (for example, methanesulfonyl or benzenesulfonyl), a ureido group having 1 to 10 carbon atoms (for example, ureido or methyl ureido), a urethane group having 2 to 10 carbon atoms (for example, methoxycarbonylamino or ethoxycarbonylamino), a cyano group, a hydroxy group, a nitro group, and a heterocyclic group (for example, 5-carboxybenzoxazolyl, pyridyl, sulfolanyl, furyl, pyrrolyl, pyrrolidinyl, morpholinyl, piperazinyl or pyrimidinyl). The example of the dye of the invention) is listed below.

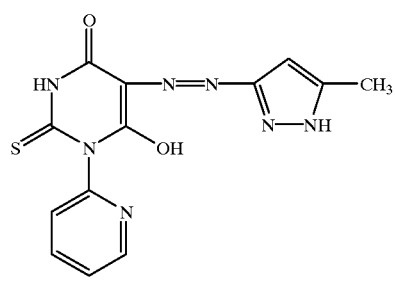

D-1

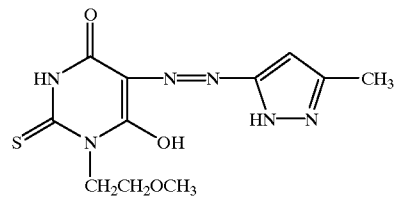

D-2

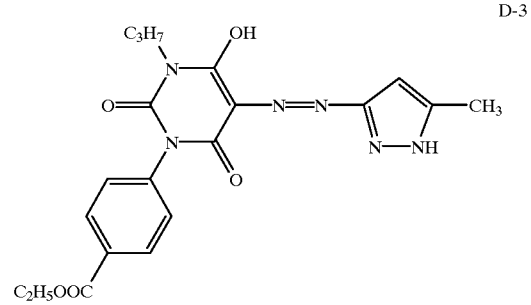

D-3

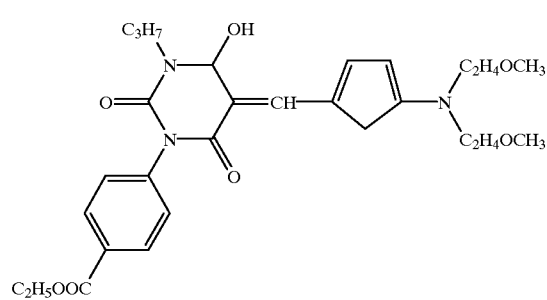

D-4

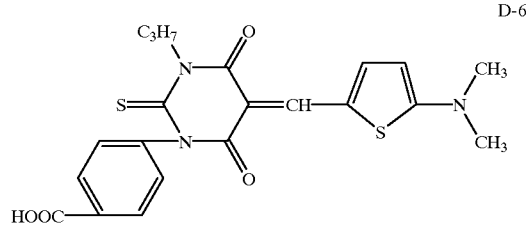

D-5

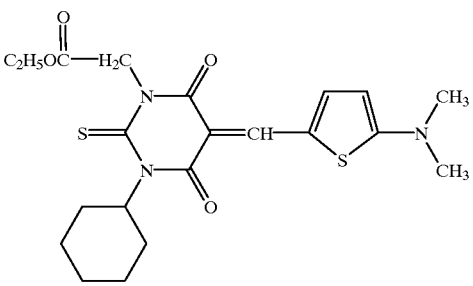

D-6

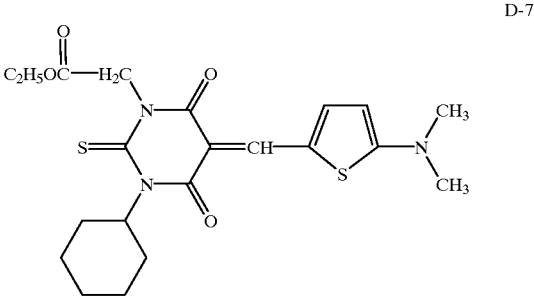

D-7

-continued
D-8
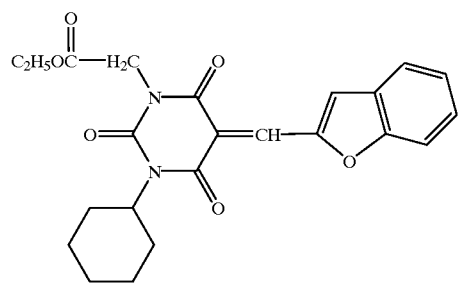
D-9
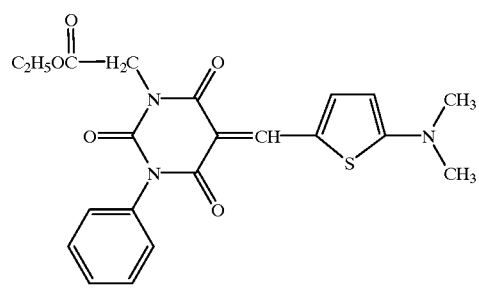
D-10
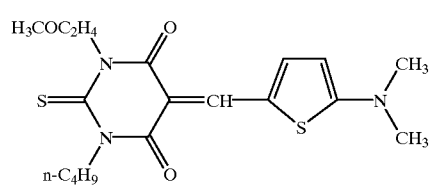
D-11
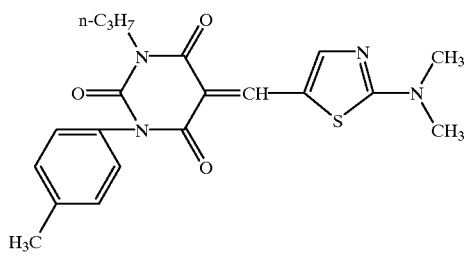
D-12
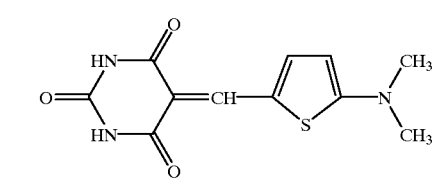
D-13
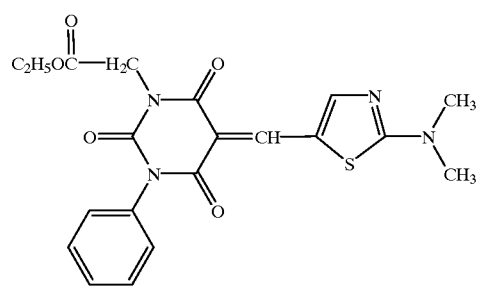
-continued
D-14
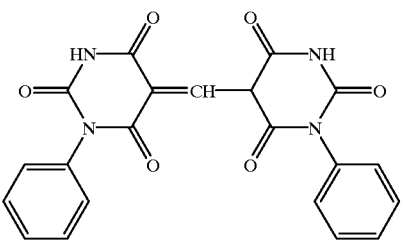
D-15
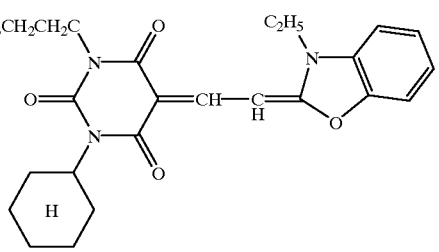
D-16
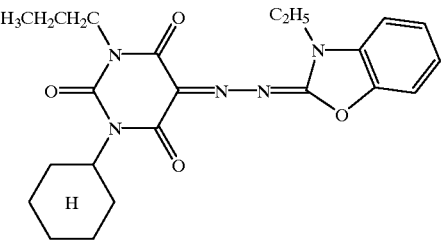
D-17
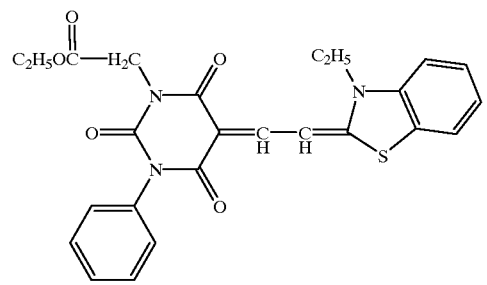
D-18
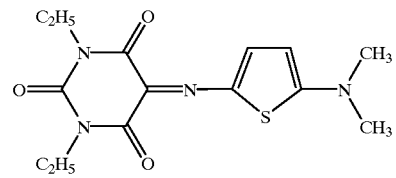
D-19
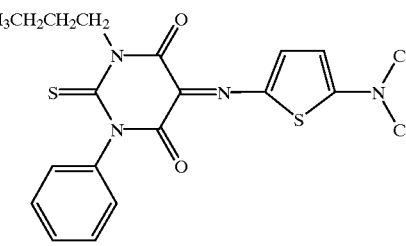

-continued

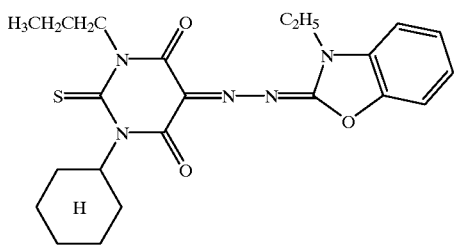
D-20

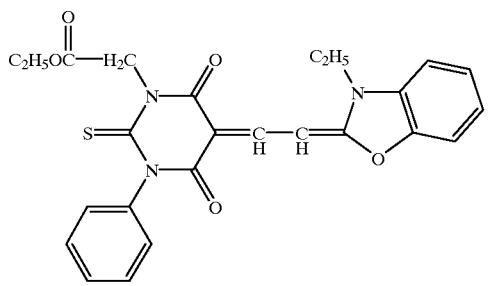
D-21

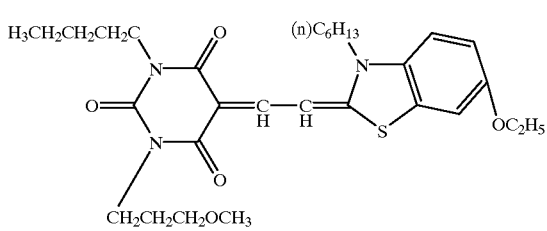
D-22

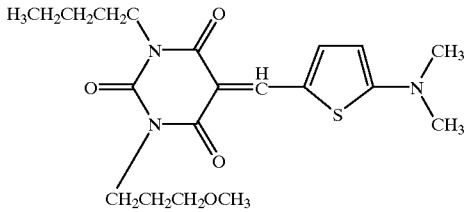
D-23

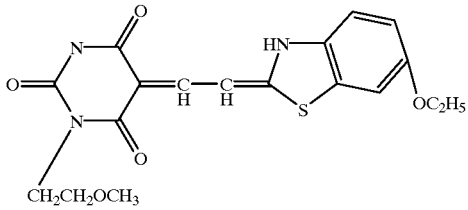
D-24

The photopolymerizable composition in the invention contains the dye of the invention in an amount of preferably 0.01 to 10 weight parts based on the weight of the compound having an ethylenically unsaturated bond.

The dye in the invention can be synthesized according to a conventional method. The synthetic example will be shown below.

Synthetic Example 1

(Synthesis of D-5)

(Synthetic Process)

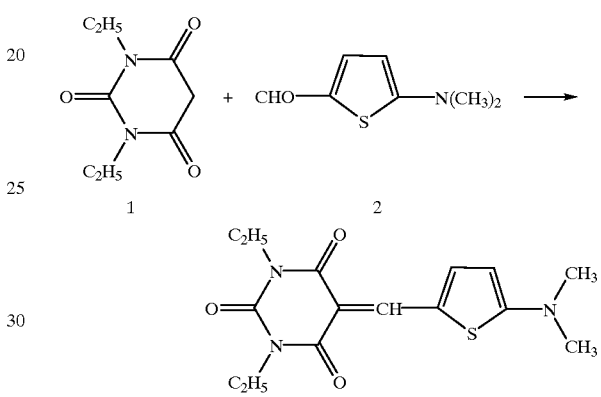

To 30 ml of ethanol were added 1.84 g of N,N'-diethylbarbituric acid (Compound 1) and 1.71 g of N,N'-dimethylthiophene aldehyde (Compound 2). The resulting mixture was refluxed for one hour, and the resulting precipitates were filtered out, washed with ethanol-acetone and dried. Thus, Exemplified Compound D-5 was obtained. The yield was 2.18 g (63%). The compound was identified using an nmr and mass spectrum method.

Synthetic Example 2

(Synthesis of D-22)

(Synthetic Process)

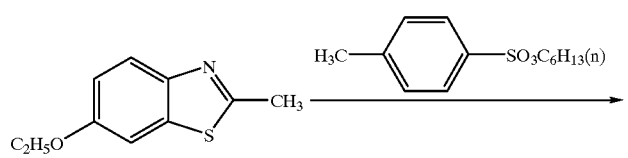

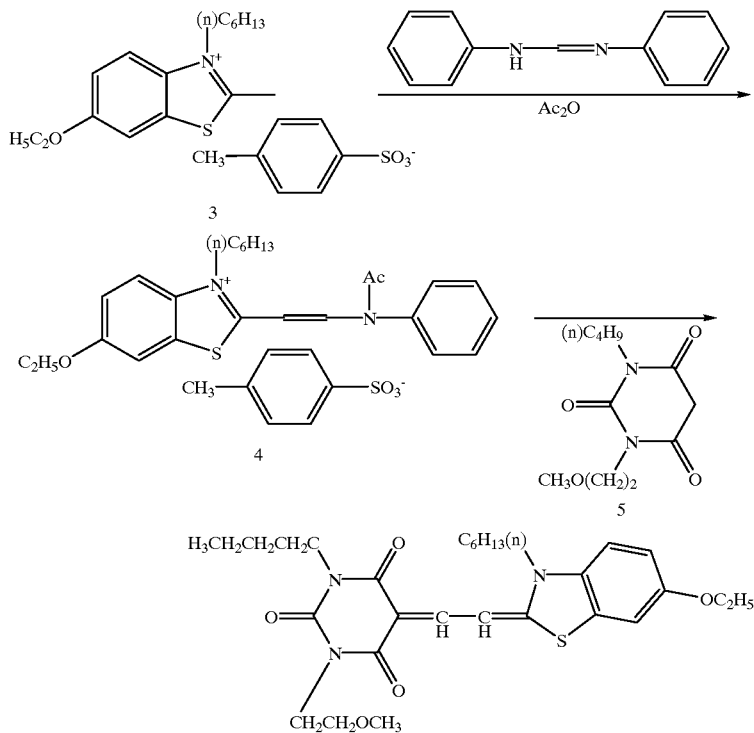

Into a 100 ml egg-plant type flask were placed 20 g of 2-methyl-5-methoxybenzothiazole and n-propyl-p-toluenesulfonate. The resulting mixture was stirred at 150° C. for one hour, and allowed to stand overnight. Acetone was added to the resulting mixture to produce precipitates. Thus, 40 g of Compound 3 were obtained. Forty grams of Compound 3 and 22 g of diphenylformamidine were placed into a 200 ml egg-plant type flask, stirred at 130° C. for 10 minutes, then added with 60 ml of acetic anhydride, and stirred for additional 10 minutes while heating. The reaction mixture was cooled and poured into isopropyl ether to produce precipitates. The resulting precipitates were filtered out, Thus, 16 g of Compound 4 were obtained.

Into a 100 ml egg-plant type flask were placed 6.0 g of Compound 4, 3.1 g of N-n-butyl-N-(3-methoxy) ethylbarbituric acid, Compound 5, 20 ml of pyridine and 1 ml of triethylamine. The resulting mixture was stirred while heating, and 3 ml of acetic anhydride was added and stirred at 100° C. for 30 minutes. The resulting reaction mixture was added to 100 ml of a 1 N hydrochloric acid solution, and the resulting mixture was abstracted with 80 ml of ethyl acetate. The ethyl acetate phase was washed with a 10% sodium bicarbonate solution, concentrated under reduce pressure to produce precipitates. The precipitates were recrystallized from acetonitrile. Thus, 3.0 g of Exemplified Dye, D-22 was obtained. The compound was identified using an nmr and mass spectrum method.

Next, a radical generating agent will be explained.

The radical generating agent in the invention is selected from the group consisting of an organic peroxide, an onium compound, a halogenated triazine, an iron arene complex, a bisimidazole and a titanocene compound.

As the organic peroxides, the peroxides disclosed in Japanese Patent O.P.I. Publication Nos. 59-1504 and 61-240807 can be used. Typical examples of the peroxides include ketone peroxides such as methylethyl ketone peroxide, methylisobutyl ketone peroxide, cyclohexanone peroxide, methylcyclohexanone peroxide and 3,3,5-trimethylcyclohexanone peroxide, diacyl peroxides such as acetylperoxide, propionylperoxide, isobutylperoxide, octanoylperoxide, 3,5,5-trimethylhexanoylperoxide, decanoylperoxide, lauroylperoxide, benzoylperoxide, p-chlorobenzoylperoxide, 2,4-dichlorobenzoylperoxide and acetylcyclohexanesulfonylperoxide, hydroperoxides such as tert-butylhydroperoxide, cumenehydroperoxide, diisopropylbenzene hydroperoxide, p-methanehdroperoxide, 2,5-dimethylhexane-2,5-dihydroperoxide and 1,1,3,3-tetrametylbutyl hydroperoxide, peroxyketals such as di-tert-butylperoxide, tert-butylcumylperoxide, 1,3-bis(tert-butylperoxyisopropyl) benzene, 2,5-di(tert-butylperoxy)-1, 3,5-trimethylcyclohexane and n-butyl-4,4'-bis(tert-butylperoxy)butane, alkylperesters such as tert-butylperoxyacetate, tert-butylperoxyisobutylate, tert-butylperoxyoctate, tert-butylperoxypivalate, tert-butylperoxyneodecanate, tert- butylperoxy-3,5,5-trimethylhexanoate, tert-butylperoxybenzoate, di-tert-butylperoxyphthalate, di-tert-butylperoxyisophthalate, tert-butylperoxylaurate and 2,5-dimethyl-2,5-dibenzoylperoxyhexane, peroxycarbonates such as di-2-ethylhexylperoxydicarbonate, di-isopropylperoxydicarbonate, di-sec-butylperoxycarbonate, di-propylperoxydicarbonate, dimethoxy-isopropylperoxydicarbonate, di-3-methoxybutylperoxydicarbonate, di-ethoxyethylperoxydicarbonate, and bis-(4-tert-butylcyclohexyl)-peroxydicarbonate, and water soluble peroxides such as succinic acid peroxide.

The especially preferable peroxide is an organic peroxide (BTTB) represented by the following formula:

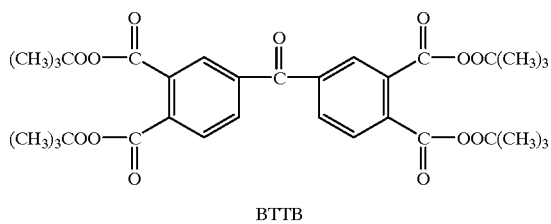

BTTB

The irone arene complex preferably used in the invention includes those represented by the following formula:

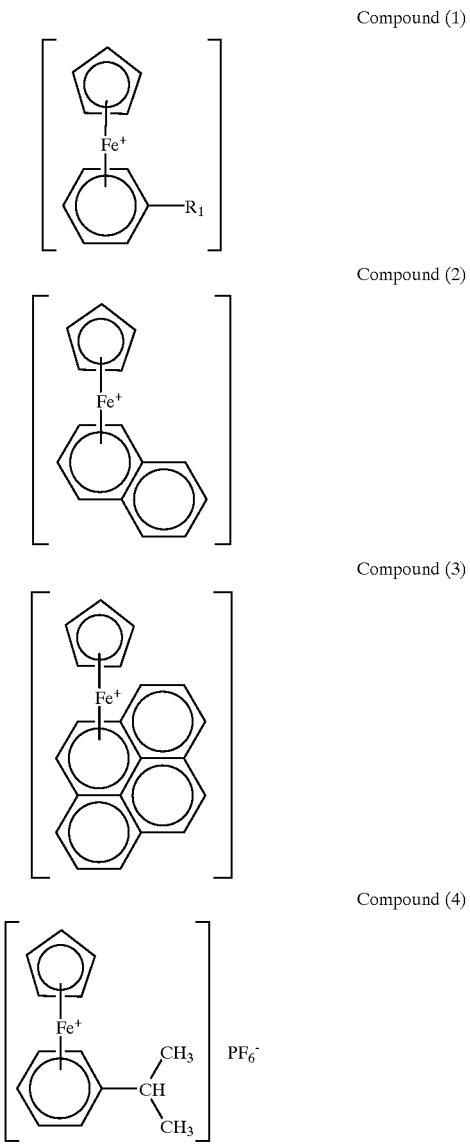

Compound (1)

Compound (2)

Compound (3)

Compound (4)

Of these compounds, Compound (4) is especially preferable.

The titanocene compound preferably used in the invention is not specifically limited, but those disclosed in Japanese Patent O.P.I. Publication Nos. 59-152396 and 61-151197 can be cited. The typical titanocene compound includes di-cyclopentadienyl-Ti-dichloride, di-cyclopentadienyl-Ti-bisphenyl, di-cyclopentadienyl-Ti-bis-2,3,4,5,6-pentafluorophenyl-1-yl, di-cyclopentadienyl-Ti-bis-2,3,5,6-tetrafluorophenyl-1-yl, di-cyclopentadienyl-Ti-bis-2,4,6-trifluorophenyl-1-yl, di-cyclopentadienyl-Ti-bis-2,6-difluorophenyl-1-yl, di-cyclopentadienyl-Ti-bis-2,4-difluorophenyl-1-yl, di-methylpentadienyl-Ti-bis-2,3,4,5,6-pentafluorophenyl-1-yl, di-methylpentadienyl-Ti-bis-2,3,5,6-tetrafluorophenyl-1-yl, di-methylpentadienyl-Ti-bis-2,6-difluorophenyl-1-yl and di-cyclopentadienyl-Ti-bis-2,6-difluoro-3-(pyrrole-1-yl)-phenyl-1-yl (hereinafter referred to as Ti-1). Of these compounds, Ti-1 is especially preferable. Ti-1 is represented by the following formula:

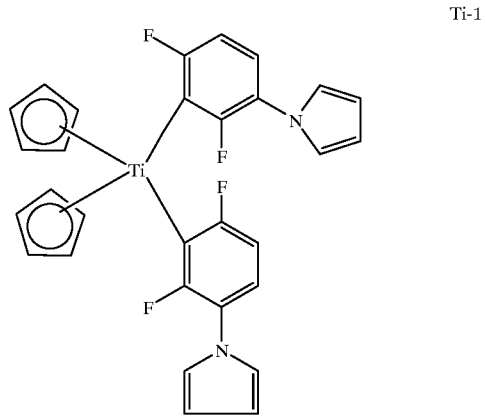

Ti-1

In the invention, the following onium salt is preferably used. The onium salt includes an iodonium salt, a sulfonium salt, a phosphonium salt and a stannonium salt.

The various onium compounds disclosed in Japanese Patent Publication No. 55-39162 and Japanese Patent O.P.I. Publication No. 59-14023 and in Macromolecule, Vol. 10, p.1307 (1977) can be used.

As the iodonium salt, the aryliodonium salt is preferably used.

The example of the onium salt includes a chloride, bromide, fluoroborate, hexafluoroborate, hexafluorophosphate, hexafluoroarsenate, hexafluoroantimonate, perchlorate, benzenesulfonate, p-toluenesulfonate, p-trifluoromethylbenzene sulfonate or boron butyl triphenyl salt of diphenyliodonium, ditolyliodonium, phenyl(p-methoxyphenyl)iodonium, bis(m-nitrophenyl)iodonium, bis(p-t-butylphenyl)iodonium or bis(p-cyanophenyl)iodonium.

The dimer of 2,4,5-triarylimidazole can be preferably used in the invention. The dimer represented by the following formula disclosed in Japanese Patent O.P.I. Publication Nos. 55-127550 and 60-202437 is preferably used.

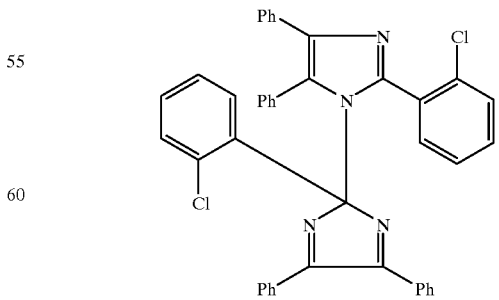

The addition amount of the radical generating agent is preferably 0.01 to 10 parts by weight based on 100 parts by weight of a compound having at least one ethylenically unsaturated bond, although the amount varies on the usage conditions or kinds of radical generating agent.

The binder used in the light sensitive layer in the invention includes conventional binders. The example of the binders includes those disclosed in U.S. Pat. No. 4,072,527. The preferable binder is a copolymer of a monomer having an aromatic hydroxy group disclosed in Japanese Patent O.P.I. Publication No. 54-98613, for example, N-(4-hydroxyphenyl)acrylamide, N-(4-hydroxyphenyl) methacrylamide or o-, m- or p-hydroxyphenyl-methacrylamide, with another monomer, a polymer of a hydroxyethylacrylate or hydroxyethylmethacrylate disclosed in U.S. Pat. No. 4,123,276, a natural resin such as shellac or rosin, polyvinyl alcohol, a polyamide resin disclosed in U.S. Pat. No. 3,751,257 and a linear polyurethane, a polyvinyl alcohol phthalate resin, an epoxy resin of bisphenol A and epichlorhydrin, a cellulose resin such as cellulose acetate or cellulose acetate phthalate disclosed in U.S. Pat. No. 3,660,097.

One or more of the above mentioned resins can be used as a binder resin.

Of these resins, a solvent soluble polymers such as polyvinyl chloride, vinyl chloride-vinylacetate copolymer, an acryl resin, a methacryl resin, polystyrene, polycarbonate, polysulfone, polyethersulfone, polyvinyl butyral, styrene-acrylonitrile copolymer, polyvinyl acetal, nitrocellulose or ethylcellulose are preferable.

These binders may be used in solution employing one or more solvents or in latex dispersion. The amount used of the binder is preferably 1.0 to 20 g/m$^2$ of support, although different depending on whether the light sensitive layer is single layered or multi-layered.

Next, the ethylenically unsaturated compound will be explained.

The compound having an ethylenically unsaturated double bond is a compound capable of being addition polymerized by a photo-initiator on exposure of an active light and hardened. The compound includes a monomer having an ethylenically unsaturated double bond and a polymer having an ethylenically unsaturated double bond in its main or side chain. The monomer herein referred to implies one in contrast to a polymeric compound, and includes a dimer, a trimer and an oligomer besides a monomer in a narrow sense.

As a polymerizable compound, a conventional monomer can be used without any limitations. The examples include a monofunctional acrylate such as 2-ethylhexylacrylate, 2-hydroxyethylacrylate or 2-hydroxypropylacrylate or its derivative or a methacrylate, itaconate, crotonate and maleate alternative of the above acrylate, a bifunctional acrylate such as polyethyleneglycoldiacrylate, pentaerythritoldiacrylate, bisphenol A diacrylate or diacrylate of an e-caprolactone adduct of hydroxypivalic acid neopentylglycol or its derivative or a dimethacrylate, diitaconate, dicrotonate and dimaleate alternative of the above diacrylate, a polyfunctional acrylate such as trimethylolpropanetri(meth)acrylate, dipentaerythritolpentaacrylate, dipentaerythritolhexaaacrylate or pyrrogallol triacrylate or its derivative or a methacrylate, itaconate, crotonate and maleate alternative of the above acrylate.

The prepolymer, in which acrylic acid or methacrylic acid is incorporated into a polymer having an appropriate molecular weight and photopolymerization is provided, is suitably used.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds disclosed on pages 286 to 294 of "11290 Chemical Compounds" edited by Kagakukogyo Nipposha, and compounds disclosed on pages 11 to 65 of "UV.EB Koka Handbook (Materials)" edited by Kobunshi Kankokai can be suitably used.

Of these compounds, compounds having two or more acryl or methacryl groups in its molecule are preferable, and those having a molecular weight of not more than 10,000, preferably not more than 5,000 are preferable.

In the invention, these monomers or prepolymers can be used singly or in combination. The light sensitive layer contains those compounds in an amount of preferably 20 to 80 weight % and more preferably 30 to t0 weight %.

Other additives such as a sensitizer, a polymerization promoting agent, a thermal polymerization inhibitor, a heat fusible compound, an oxygen quencher and a plasticizer can be added to the sensitive layer in the invention, as long as the effect of the invention is jeopardized.

The polymerization promoting agent or chain transfer catalyst represented by amines or sulfur compounds (for example, thiols or disulfides) can be added to the light sensitive layer.

The polymerization promoting agent or chain transfer catalyst can be added to the photopolymerizable composition of the invention. The examples thereof includes amines such as N-phenyl glycine, triethanolamine, and N,N-diethylaniline, thiols as disclosed in U.S. Pat. No. 4,414,312 and Japanese Patent O.P.I. Publication No. 64-13144/1988, disulfides as disclosed in Japanese Patent O.P.I. Publication No. 2-291561/1990, thions as disclosed in U.S. Pat. No. 3,558,322 and Japanese Patent O.P.I. Publication No. 64-17048/1988, o-acylthiohydroxamate or N-alkoxypyridinethions as disclosed in Japanese Patent O.P.I. Publication No. 2-291560/1990. The preferable amine is N,N-diethylaniline, and the preferable sulfur compound is 2-mercaptobenzothiazole.

The thermal polymerization inhibitor is preferably a quinone or phenol type compound, for example, hydroquinone, pyrogallol, p-methoxyphenol, catechol, β-naphtol or 2,6-di-t-butyl-p-cresol. The inhibitor content of the light sensitive layer is not more than 10 parts by weight, and preferably 0.01 to 5 parts by weight based on the 100 parts by weight of a polymerizable ethylenically unsaturated compound and a binder.

The oxygen quencher is preferably an N,N-dialkylaniline derivative, for example, a compound disclosed in column 11, line 58 to column 12, line 35 of U.S. Pat. No. 4,772,541.

The plasticizer includes phthalates, trimellitates, adipates, or another saturated or unsaturated carboxylate, citrates, epoxidated soybean oil, epoxidated linseed oil, epoxidated stearic acids, phosphates, phosphites, and glycol esters.

The heat fusible solvent includes compounds which are solid at ordinary temperature and thermally reversibly liquefies or softens. The example thereof includes alcohols such as terpineol, menthol, 1,4-cyclohexanediol and phenol, amides such as acetoamide and benzamide, cumarine, esters such as benzyl cinnamate, ethers such as diphenylether and crown ether, ketones such as camphor and p-methylacetophenone, aldehydes such as vanillin and dimethoxybenzaldehyde, hydrocarbons such as norbornene and stilbene, a higher fatty acid such as margaric acid, a higher alcohol such as eicosanol, a higher fatty acid ester such as cetylpalmitate, a higher fatty acid amide such as stearic amide, a higher fatty acid amine such as behenylamine, waxes such as bees wax, candelilla wax, paraffin wax, ester wax, montan wax, carnauba wax, amide wax, polyethylene wax and microcrystalline wax, rosin derivatives such as ester gum, rosin-maleic acid resins and rosin phenol resins, a phenol resin, a ketone resin, an epoxy resin, a diallylphthalate resin, a terpene type hydrocarbon resin, a cyclopentadiene resin, a polyolefin resin, a polycaprolactam resin, and polyethylene oxides such as polyethylene glycol and polypropylene glycol.

The light sensitive layer may optionally contain an anti-oxidant, a filler or an anti-static agent. The anti-oxidant includes a chromane compound, phenol derivatives, hydroquinone derivatives, hindered amine derivatives, spiroindanes, sulfur-containing compounds, phosphor-containing compounds, compounds disclosed in Japanese Patent O.P.I. Publication Nos. 59-182785/1984, 60-130735/1985, 61-159644/1986 and 1-127389/1989, and compounds disclosed in Kagakukogyo Nipposha, "11290 Chemical Compounds", pages 862 to 868 and compounds well known as those improving durability of photographic or other image forming materials.

The filler includes inorganic or organic fine particles. The inorganic fine particles include silica gel, calcium carbonate, zinc oxide, barium sulfate, talc, clay, kaorine, Japanese acid clay, activated clay and alumina. The organic fine particles include fluorine-containing resin particles, guanamine resin particles, acryl resin particles, and silicone resin particles. The anti-static agent include a cationic surfactant, an anionic surfactant, a nonionic surfactant, a polymer anti-static agent, conductive fine particles and compounds disclosed on pages 875 and 876 of Kagakukogyo Nipposha, "11290 Chemical Compounds".

The light sensitive layer in the invention may be a single layer or plural layers. The plural light sensitive layers may be different in composition from each other and may comprise a light sensitive layer containing no colorant.

The thickness of the light sensitive layer is preferably 0.2 to 10 $\mu$m and more preferably 0.5 to 5 $\mu$m.

The light sensitive layer is formed by dissolving or dispersing the light sensitive layer composition in a solvent to obtain a coating solution, coating the solution on a described later and then drying.

A protective layer is preferably provided on the light sensitive layer. The protective layer preferably has a high solubility in an alkaline developer solution. The layer is comprised of preferably polyvinyl alcohol, polysaccharide, polyvinyl pyrrolidone, polyethylene glycol, glue, casein, hydroxyethylcellulose, carboxymethylcellulose, methylcellulose, hydroxyethyl starch, gum arabic, sucrose octaacetate, ammonium alginate, sodium alginate, polyvinyl amine, polyethylene oxide, polystyrene sulfonic acid, polyacrylic acid or a water soluble polyamide. These may be used singly or in admixture of two or more kinds. Of these compounds, polyvinyl alcohol is especially preferable. These compounds are dissolved in an appropriate solvent and coated on the light sensitive layer to form a protective layer. The thickness of the protective layer is preferably 0.1 to 5.0 $\mu$m, and more preferably 0.5 to 3.0 $\mu$m. The protective layer optionally contains a surfactant or a matting agent.

The solvent includes water, alcohols (such as ethanol and propanol), cellosolves (such as methyl cellosolve and ethyl cellosolve), aromatic hydrocarbons (such as toluene, xylene and chlorobenzene), ketones (such as acetone and methylethylketone), esters (such as ethyl acetate and butyl acetate), ethers (such as tetrahydrofurane and dioxane), halogenated hydrocarbons (such as chloroform and trichloroethylene), amides (such as dimethylformamide and N-methylpyrrolidone) and dimethylsulfoxide.

The coating method includes a gravure coating method, an extrusion coating method, a wire bar coating method and a roller coating method.

The support includes paper, synthetic paper (for example, synthetic paper made mainly of polypropylene), a resin film or sheet, a plastic film or sheet having two or more layers laminated, a film or sheet in which a resin layer is laminated on various polymer materials, metals, ceramics or paper made of tree pulp, cellulose pulp or sulfite pulp.

The resin constituting the resin film or sheet includes an acryl resin such as acrylate or methacrylate, a polyester such as polyethylene terephthalate, polybutylene terephthalate, polyethylene naphthalate, polycarbonate or polyarylate, polyvinyl chloride, polyvinylidene chloride, polyvinylidene fluoride, polyolefin such as polyethylene or polyethylene, polypropylene, polystyrene, nylon, polyamide such as aromatic polyamide, polyether ketone, polysulfone, polyethersulfone, polyimide, polyetherimide, polyparabanic acid, a phenoxy resin, an epoxy resin, a urethane resin, a melamine resin, an alkyd resin, a phenol resin, a fluorine-containing resin and a silicone resin.

The support of the presensitized planographic printing plate of the invention, on which the light sensitive layer is provided, includes a metal plate such as aluminium, zinc, steel or copper, a metal plate, paper sheet, plastic film or glass plate which is plated or vacuum evaporated with chromium, zinc, copper, nickel, aluminium or iron, a paper sheet coated with a resin, a paper sheet laminated with a metal foil such as aluminium and a plastic film subjected to hydrophilic treatment. Of these, an aluminium plate is preferable. The support is preferably an aluminium plate which is subjected to a surface treatment such as graining treatment, anodizing treatment or sealing treatment. The surface treatment is carried out by a conventional method. The graining treatment includes a mechanically graining method and an electrolytically etching method. The mechanically graining method includes a ball graining method, a brush graining method, a liquid horning graining method and a buff graining method. The above methods can be used singly or in combination according to an aluminium material composition. The electrolytically etching method is preferable.

The electrolytically etching is carried out in a bath containing one or more of phosphoric acid, sulfuric acid, hydrochloric acid and nitric acid. After graining, the surface of the support is optionally subjected to desmut treatment using an alkaline or acid solution to neutralize and washed with water.

The anodizing is carried out by electrolyzing the surface of the aluminium support using the aluminium plate as an anode in a solution containing one or more of sulfuric acid, chromic acid, oxalic acid, phosphoric acid and malonic acid. The thickness of the anodizing film formed is suitably 1 to 50 mg/dm$^2$, and preferably 10 to 40 mg/dm$^2$. The thickness of the anodizing film is obtained by immersing the anodized aluminium in a solution containing phosphoric acid and chromic acid to dissolve the anodized film and measuring the aluminium weight before and after the immersing.

The sealing is carried out by treating the aluminium support with a boiling water, steam, a sodium silicate solution or a dichromic acid solution The thickness of the support is ordinarily 3 to 1000 $\mu$m, and preferably 8 to 300 $\mu$m.

EXAMPLES

Next, the present invention will be explained in the examples, but is not limited thereto.

Example 1

(Preparation of Support)

A 0.24 mm thick aluminum plate (material 1050, quality H16) was degreased at 60° C. for one minute in a 5% sodium hydroxide solution, washed with water, immersed at 25° C. for one minute in 10% hydrochloric acid solution to neutralize and then washed with water. The resulting plate was electrolytically etched using an alternating current at 25° C. for 60 seconds at a current density of 100 A/dm$^2$ in a 1.0 weight % hydrochloric acid solution, desmut at 60° C. for 10 seconds in a 5% sodium hydroxide solution. The desmut plate was anodized at 30° C. for 6 minutes at a current density of 4 A/dm$^2$ in a 40% phosphoric acid solution, and sealed using a sodium silicate solution. Thus, an aluminum support for a planographic printing plate was obtained.

(Light Sensitive Layer Coating)

The aluminum plate was coated with the following light sensitive layer composition and dried at 80° C. for 3 minutes to give a light sensitive layer having a coating thickness of 1.3 g/m$^2$.

| | |
|---|---|
| Dye (Exemplified Dye D-5) | 0.20 parts by weight |
| Radical generating agent BTTB | 0.40 parts by weight |
| Pentaerythritoltetraacrylate M450 | 4.47 parts by weight |
| (produced by Toa Gosei Co., Ltd.) | |
| Fluorine-containing surfactant | 0.10 parts by weight |
| (Megafax F179, produced by Dainihon Ink Co., Ltd.) | |
| Polymerization inhibitor | 0.02 parts by weight |
| (Sumirizer GS, produced by Sumitomo Kagaku Co., Ltd.) | |
| Methylethyl ketone | 45 parts by weight |
| Propylene glycol monomethyl ether | 45 parts by weight |
| Copper-phthalocyanine pigment | 0.58 parts by weight |
| (particle size of 0.3 μm) | |
| (Protective layer coating) | |

(Protective layer coating)
On the light sensitive layer was coated the following protective layer composition and dried at 80° C. for 3 minutes to give a protective layer having a coating thickness of 1.3 g/m$^2$. Thus, photopolymerization type presensitized planographic printing plate sample No. 1 was obtained.
Protective layer composition

| | |
|---|---|
| Polyvinyl alcohol Gosenol GL-05 | 9.9 parts by weight |
| Fluorine-containing surfactant | 0.1 parts by weight |
| (Megafax F120, produced by Dainihon Ink Co., Ltd.) | |
| Water | 90 parts by weight |

Examples 2 through 20

Sample Nos. 2 through 20 were prepared in the same manner as in sample No. 1, except that the dye and the radical generating agent were changed to those shown in Table 1. As Titanocene compound Ti-1, CGI 784 produced by Ciba Geigy Co., Ltd. was used.

Example 21

Sample No. 21 was prepared in the same manner as in sample No. 1, except that the light sensitive layer was changed to the following light sensitive layer composition.

| | |
|---|---|
| Dye (Exemplified Dye D-22) | 0.20 parts by weight |
| Radical generating agent BTTB | 0.40 parts by weight |
| Pentaerythritoltetraacrylate M450 | 4.47 parts by weight |
| (produced by Toa Gosei Co., Ltd.) | |
| Polymerization promoting agent 1 | 0.45 parts by weight |
| (Iron-arene complex) | |
| Polymerization promoting agent 2 | 0.083 parts by weight |
| (Mercaptobenzoxazole) | |
| Fluorine-containing surfactant | 0.10 parts by weight |
| (Megafax F179, produced by Dainihon Ink Co., Ltd.) | |
| Polymerization inhibitor | 0.02 parts by weight |
| (Sumirizer GS, produced by Sumitomo Kagaku Co., Ltd.) | |
| Methylethyl ketone | 45 parts by weight |
| Propylene glycol monomethyl ether | 45 parts by weight |
| Copper-phthalocyanine pigment | 0.58 parts by weight |
| (particle size of 0.3 μm) | |

Examples 22 through 30

Sample Nos. 22 through 30 were prepared in the same manner as in sample No. 21, except that the dye, the radical generating agent and polymerization promoting agents 1 and 2 were changed to those shown in Table 1. As Titanocene compound Ti-1, CGI 784 produced by Ciba Geigy Co., Ltd. was used.

The main constitution of sample Nos. 1 through 30 is shown in Table 1.

Comparative Compound 1

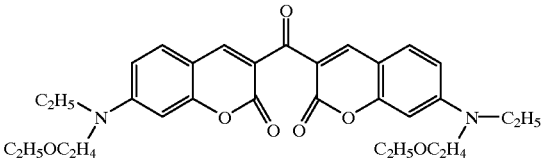

Comparative Compound 2

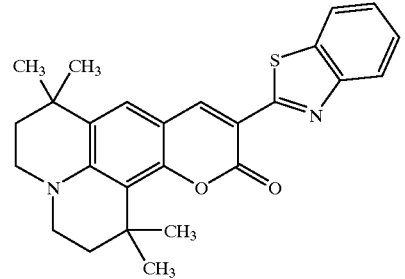

TABLE 1

| Sample No. | Dye | Radical generating agent | Addition amount (%) | Polymerization promoting agent 1 | Addition amount (%) | Polymerization promoting agent 2 | Addition amount (%) |
|---|---|---|---|---|---|---|---|
| 1 | D-5 | BTTB | 0.40 | — | — | — | — |
| 2 | D-2 | BTTB | 0.40 | — | — | — | — |
| 3 | D-10 | BTTB | 0.40 | — | — | — | — |
| 4 | D-15 | BTTB | 0.40 | — | — | — | — |
| 5 | D-20 | BTTB | 0.40 | — | — | — | — |
| 6 | D-21 | BTTB | 0.40 | — | — | — | — |
| 7 | D-22 | BTTB | 0.40 | — | — | — | — |
| 8 | D-5 | Ti-1 | 0.40 | — | — | — | — |
| 9 | D-2 | Ti-1 | 0.40 | — | — | — | — |
| 10 | D-10 | Ti-1 | 0.40 | — | — | — | — |
| 11 | D-15 | Ti-1 | 0.40 | — | — | — | — |
| 12 | D-20 | Ti-1 | 0.40 | — | — | — | — |
| 13 | D-21 | Ti-1 | 0.40 | — | — | — | — |
| 14 | D-24 | Ti-1 | 0.40 | — | — | — | — |
| 15 | D-22 | Diphenyl iodonium salt | 0.40 | — | — | — | — |
| 16 | D-22 | 1,3,5-Tristrichloro-s-triazine | 0.40 | — | — | — | — |
| 17 | D-22 | Bis-imidazole | 0.40 | — | — | — | — |
| 18 | D-22 | Iron arene complex | 0.40 | — | — | — | — |
| 19 | D-2 | Ti-1 | 0.40 | — | — | — | — |
| 20 | D-22 | Boronium salt compound | 0.40 | — | — | — | — |
| 21 | D-22 | BTTB | 0.40 | Iron arene complex | 4.0 | 1,3,5-Pentamethyl-aniline | 4.0 |
| 22 | D-22 | BTTB | 0.40 | Iron arene complex | 4.0 | Mercapto-benzoxazole | 4.0 |
| 23 | D-15 | BTTB | 0.40 | Iron arene complex | 4.0 | Mercapto-benzoxazole | 4.0 |
| 24 | D-22 | Ti-1 | 0.40 | Iron arene complex | 4.0 | 1,3,5 Pentamethyl-aniline | 4.0 |
| 25 | D-22 | Ti-1 | 0.40 | Iron arene complex | 4.0 | Mercapto-benzoxazole | 4.0 |
| 26 | D-15 | Ti-1 | 0.40 | Iron arene complex | 4.0 | Mercapto-benzoxazole | 4.0 |
| 27 | Comparative compound 2 | BTTB | 0.40 | — | — | — | — |
| 28 | Comparative compound 2 | BTTB | 0.40 | Iron arene complex | 4.0 | 1,3,5-Pentamethyl-aniline | 4.0 |
| 29 | Comparative compound 2 | BTTB | 0.40 | — | — | — | — |
| 30 | Comparative compound 2 | BTTB | 0.40 | Iron arene complex | 4.0 | 1,3,5-Pentamethyl-aniline | 4.0 |

The iron arene complex in Table 1 is Exemplified Compound (4).

(Image forming)

The above obtained photopolymerization type planographic printing plate sample was imagewise exposed employing a roomlight printer P-627-HA (produced by Dainihon Screen Co., Ltd.), immersed with the following developer at 30° C. for 30 seconds to dissolve out the unexposed light sensitive layer, washed with water and dried to form an image.

Developer Composition

| | |
|---|---|
| Potassium silicate A (SiO$_2$ = 26%, K$_2$O = 13.5% produced by Nihon Kagakukogyo Co., Ltd.) | 400 parts by weight |
| Potassium hydroxide (50% aqueous solution) | 195 parts by weight |
| N-phenylethanolamine | 6 parts by weight |
| Propylene glycol | 50 parts by weight |
| P-tert-butyl benzoic acid | 150 parts by weight |
| Potassium sulfite | 300 parts by weight |
| Nonionic surfactant Emulgen 147 (produced by Kao Co., Ltd.) | 5 parts by weight |
| Gluconic acid (50% aqueous solution) | 100 parts by weight |
| Triethanolamine | 25 parts by weight |
| Water | 11500 parts by weight |

The developer was adjusted to pH 12.5.

The thus obtained planographic printing plate was evaluated according to the following criteria.

<<Evaluation of Stain>>

An image was prepared using Ugra plate control wedge PCW82 (made by Mika Denshi Co.) with an exposure amount necessary to give a continuous tone wedge of 3 steps, and then printing was conducted on a printing machine (Heidel GTO) wherein a coated paper, printing ink (Hyplus M magenta made by Toyo Ink Manufacturing Co., Ltd.) and dampening water (2.5% SEU-3 aqueous solution made by Konica Corp.) were used. Stain on a non-image area of a print at the initial stage in printing (at a point of about 1000 prints) was evaluated according to the following four evaluation criteria.

A: No stain on a non-image area of a print
B: Occurrence of slight stain on a non-image area of a print
C: Definite occurrence of stain on a non-image area of a print, and problematic
D: Occurrence of stain on entire non-image area of a print <<Evaluation of sensitivity>>

The presensitized planographic printing plate sample was wound around a drum so that the protective layer faces the light source, and was exposed to a 100 mW YAG laser (DRY315M, KD excitation SHG, YAG laser (532 nm): produced by ADLAS Co., Ltd.) while the drum was rotating at a constant rate of rotation. Under the assumption that the laser beam intensity was on Gaussian distribution, light intensity ($\mu W/cm^2$) wherein a line width of the formed image is the same as that corresponding to $1/e^2$ of intensity of the laser beam was multiplied by irradiation time to obtain the energy value. The presensitized printing plate was also exposed employing a 488 nm argon laser.

<<Evaluation of storage stability>>

The presensitized printing plate was stored under the condition of 55° C. and 20% RH for 3 days. After that, the resulting presensitized printing plate was subjected to exposure and development as described above, and sensitivity was obtained in the same manner as above.

The results are shown in Table 2.

TABLE 2

| Sample No. | 488 nm Sensitivity (mJ) | 488 nm Sensitivity after storage | 532 nm Sensitivity (mJ) | 532 nm Sensitivity after storage | Stain | Remarks |
|---|---|---|---|---|---|---|
| 1 | 0.35 | 0.39 | 0.35 | 0.36 | B | Inv. |
| 2 | 0.24 | 0.25 | 0.3 | 0.31 | B | Inv. |
| 3 | 0.36 | 0.38 | 0.38 | 0.39 | B | Inv. |
| 4 | 0.29 | 0.3 | 0.12 | 0.13 | B | Inv. |
| 5 | 0.34 | 0.35 | 0.35 | 0.38 | B | Inv. |
| 6 | 0.15 | 0.15 | 0.25 | 0.26 | B | Inv. |
| 7 | 0.09 | 0.09 | 0.1 | 0.12 | A | Inv. |
| 8 | 0.33 | 0.35 | 0.34 | 0.35 | A | Inv. |
| 9 | 0.18 | 0.2 | 0.25 | 0.25 | A | Inv. |
| 10 | 0.3 | 0.32 | 0.35 | 0.36 | A | Inv. |
| 11 | 0.22 | 0.25 | 0.08 | 0.08 | A | Inv. |
| 12 | 0.3 | 0.35 | 0.3 | 0.33 | A | Inv. |
| 13 | 0.15 | 0.16 | 0.25 | 0.26 | A | Inv. |
| 14 | 0.07 | 0.07 | 0.1 | 0.12 | A | Inv. |
| 15 | 0.11 | 0.12 | 0.11 | 0.13 | B | Inv. |
| 16 | 0.12 | 0.12 | 0.1 | 0.12 | A | Inv. |
| 17 | 0.13 | 0.13 | 0.12 | 0.12 | B | Inv. |
| 18 | 0.14 | 0.14 | 0.15 | 0.18 | B | Inv. |
| 19 | 0.04 | 0.05 | 0.14 | 0.15 | B | Inv. |
| 20 | 0.12 | 0.12 | 0.14 | 0.24 | B | Inv. |
| 21 | 0.08 | 0.08 | 0.07 | 0.07 | B | Inv. |
| 22 | 0.09 | 0.09 | 0.07 | 0.07 | B | Inv. |
| 23 | 0.19 | 0.2 | 0.1 | 0.1 | B | Inv. |
| 24 | 0.03 | 0.04 | 0.1 | 0.1 | A | Inv. |
| 25 | 0.03 | 0.03 | 0.1 | 0.1 | A | Inv. |
| 26 | 0.05 | 0.06 | 0.09 | 0.1 | A | Inv. |
| 27 | 0.2 | 1.2 | 0.4 | 2.1 | C | Inv. |
| 28 | 0.25 | 1.4 | 0.35 | 2 | C | Comp. |
| 29 | 0.18 | 1.4 | 0.35 | 1.5 | C | Comp. |
| 30 | 0.15 | 0.9 | 0.33 | 1.2 | C | Comp. |

Inv.: Invention,
Comp.: Comparative

As is apparent from Table 2, the inventive samples are superior in sensitivity or stain to the comparative samples. Particularly, the samples using the dye of the invention and the radical generating agent provide high sensitivity with no stain occurrence.

What is claimed is:

1. A light sensitive composition comprising a radical generating agent and a dye represented by the following formula (1), (2) or (3):

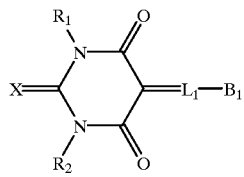

formula (1)

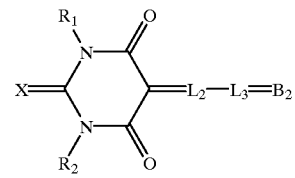

formula (2)

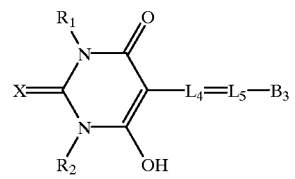

formula (3)

wherein in formula (1), $R_1$ and $R_2$ independently represent a hydrogen atom, an alkyl group, an alkenyl group, an aryl group or a 5- or 6- membered heterocyclic ring residue; X represents an oxygen atom or a sulfur atom; $L_1$ represents a nitrogen atom or a methine group; and $B_1$ represents a 5- or 6-membered heterocyclic ring residue; and in formula (2) or (3), $R_1$ and $R_2$ independently represent a hydrogen atom, an alkyl group, an alkenyl group, an aryl group or a 5- or 6-membered heterocyclic ring residue; X' represents an oxygen atom; $L_2$, $L_3$, $L_4$, and $L_5$ independently represent a nitrogen atom or a methine group; and $B_2$ and $B_3$ independently represent a 5- or 6-membered heterocyclic ring residue.

2. The light sensitive composition of claim 1, further containing, an amine compound or a sulfur compound.

3. The light sensitive composition of claim 2, further comprising a compound having an ethylenically unsaturated bond.

4. The light sensitive composition of claim 1, further comprising a compound having an ethylenically unsaturated bond.

5. The light sensitive composition of claim 4, wherein the radical generating agent is selected from the group consisting of an organic peroxide, an onium compound, a halogenated triazine, an iron arene complex, a bisimidazole, and a titanocene compound.

6. The light sensitive composition of claim 5, wherein the composition comprises the titanocene compound and the dye represented by formula (2) or (3).

7. The light sensitive composition of claim 1, wherein the radical generating agent is selected from the group consisting of an organic peroxide, an onium compound, a halogenated triazine, an iron arene complex, a bisimidazole, and a titanocene compound.

8. The light sensitive composition of claim 7, wherein the composition comprises the titanocene compound and the dye represented by formula (2) or (3).

9. The light sensitive composition of claim 1, wherein said 5- or 6-membered heterocyclic ring residue of said $B_1$ and $B_3$ is selected from the group consisting of

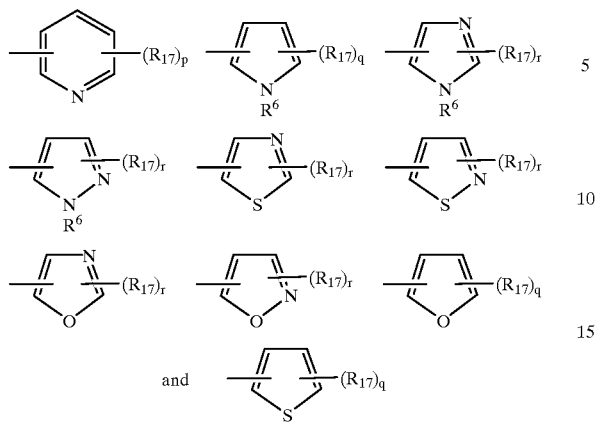

and said 5- or 6-membered heterocyclic ring residue of said $B_2$ is selected from the group consisting of

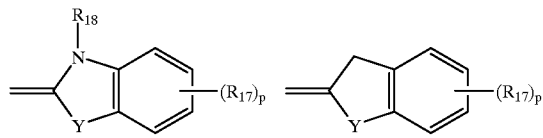

-continued

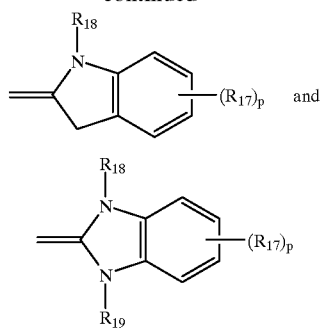

wherein $R_{17}$ represents a hydrogen atom, an alkyl group, an aryl group, $-OR_{18}$, $-SR_{18}$ or $-N(R_{19})(R_{20})$ in which $R_{18}$, $R_{19}$ and $R_{20}$ independently represent a hydrogen atom, an alkyl group or an aryl group; Y represents an oxygen atom or a sulfur atom; p represents an integer of 0 to 4; q represents an integer of 0 to 3; and r represents an integer of 0 to 2, provided that plural $R_{17}$'s may be the same or different and may combine with each other to form a ring.

* * * * *